United States Patent [19]

Naito

[11] Patent Number: 4,564,815
[45] Date of Patent: Jan. 14, 1986

[54] FM DEMODULATOR PLL WITH COMPENSATION FOR NONLINEAR VARACTOR CHARACTERISTICS

[75] Inventor: Michinori Naito, Tokyo, Japan

[73] Assignee: Trio Kabushiki Kaisha, Tokyo, Japan

[21] Appl. No.: 580,160

[22] Filed: Feb. 14, 1984

[30] Foreign Application Priority Data

Feb. 28, 1983 [JP] Japan ................................. 58-30828

[51] Int. Cl.$^4$ ........................ H03D 3/18; H03D 3/00; H03L 7/06; H04B 1/16
[52] U.S. Cl. .................................... 329/50; 329/122; 331/17; 331/36 C; 455/214
[58] Field of Search .................... 329/50, 122; 331/16, 331/17, 36 C, 178; 455/295, 214

[56] References Cited

U.S. PATENT DOCUMENTS

| | | | |
|---|---|---|---|
| 3,641,463 | 2/1972 | Perks | 331/36 C X |
| 4,129,832 | 12/1978 | Neal et al. | 331/178 X |
| 4,468,638 | 8/1984 | Kyriakos | 331/178 |

FOREIGN PATENT DOCUMENTS 2835851 2/1980 Fed. Rep. of Germany ...... 331/178
2101825 1/1983 United Kingdom ................. 329/50

OTHER PUBLICATIONS

Rippy, R. "Feedback in Phase-Locked Loop Linearizes Phase Demodulator", *Electronics*, vol. 48, No. 25, pp. 104–105, Dec. 11, 1975.

*Primary Examiner*—Eugene R. LaRoche
*Assistant Examiner*—D. C. Mis
*Attorney, Agent, or Firm*—Murray, Whisenhunt and Ferguson

[57] ABSTRACT

There is provided an improvement of an FM demodulator of the PLL system including a VCO, a phase comparator and a low-pass filter, whereby the distortion components of the FM demodulated signal to be caused due to nonlinearity of the frequency vs. control voltage characteristic of the VCO are eliminated. This improved FM demodulator of the PLL system includes a circuit for making the harmonic distortion components from the output signal of the low-pass filter and synthesizing them with the output signal of the low-pass filter so as to obtain the non-distorted FM demodulated signal.

5 Claims, 3 Drawing Figures

FM DEMODULATOR PLL WITH COMPENSATION FOR NONLINEAR VARACTOR CHARACTERISTICS

FIELD OF THE INVENTION

The present invention relates to an FM demodulator which is used in an FM tuner or the like and, more particularly, to an FM demodulator of the PLL system.

BACKGROUND ART

Although conventionally various systems are proposed as an FM demodulator, a PLL system is also one of such systems. The FM demodulator of the PLL system comprises: a voltage controlled oscillator VCO whose oscillating frequency is determined by a variable capacitance (varactor) diode; a phase comparator for receiving an FM signal and a frequency signal from the VCO and for comparing their phases; a low-pass filter for integrating an output of the phase comparator; and a closed-loop circuit for applying an output voltage of the low-pass filter as a control voltage to the varactor diode of the VCO. Once in lock, the VCO frequency tracks the frequency changes of the FM signal. Therefore, the control voltage to be applied to the varactor diode of the VCO corresponds to the frequency deviation of the FM signal, i.e., to the FM modulating signal, so that an FM demodulated signal is obtained. Such a PLL FM demodulator has advantages such that: a wide demodulation band is obtained; the characteristic is stable independently of a tuning circuit; it has a spurious suppression ability by which necessary signals are mainly demodulated, or the like; however, there is a problem on its linearity. In other words, this is because since the change ratio of the control voltage to the VARI-CAP diode vs. the change ratio of the capacitance is not ideal, this would be distortion components of the demodulated signal.

It is therefore an object of the present invention to dissolve the above-mentioned drawbacks and to provide a PLL demodulator with little distortion.

SUMMARY OF THE INVENTION

The above problem was solved by an FM demodulator of the PLL system comprising: a voltage controlled oscillator (VCO) for generating a signal of an oscillating frequency depending upon a control voltage; a phase comparator for comparing the phase and the frequency of an input FM signal with the VCO frequency signal and generating an error signal which is related to the phase and the frequency difference between the tune signals; a low-pass filter for attenuating the high frequency components of the error signal at the output of the phase comparator; a circuit for producing harmonic distortion components of the output signal of the low-pass filter; and a circuit for synthesizing the produced harmonic distortion components with the output signal of the low-pass filter so as to obtain non-distorted FM demodulated signal.

As shown in the disclosed embodiments, the present invention has a type in which a harmonic distortion compensation circuit is inserted in the closed loop of the PLL, and a type in which the distorted FM demodulated signal is fetched from the PLL closed loop, thereby eliminating the distortion components by the harmonic distortion compensation circuit.

According to the present invention, the FM demodulator of the PLL system is equipped with at least one or more multiplier(s) for receiving a signal from a low-pass filter in the FM demodulator and is constituted in such a manner that a signal/signals from the multiplier(s) is/are added to a signal from the low-pass filter. Therefore, by setting the power number of the multiplier(s) into a desired value, e.g., the 2nd power (square), the 3rd power (cube), or the like, it is possible to eliminate the higher harmonics of the dimensions (second, third) corresponding to its power number, thereby enabling the harmonic distortion in the demodulated signal to be remarkably reduced.

Therefore, even if the parts constituting the FM demodulator have nonlinearity, the distortion to be caused in association with this nonlinearity can be properly eliminated, in particular, it is possible to obtain high fidelity as a demodulator of the FM stereo tuner.

BRIEF DESCRIPTION OF THE DRAWINGS

The foregoing features and objectives together with the operation of the present invention will be more apparent from the following description, taken in conjunction with the drawings, in which.

DESCRIPTION OF THE ILLUSTRATIVE EMBODIMENTS

Figure 1:
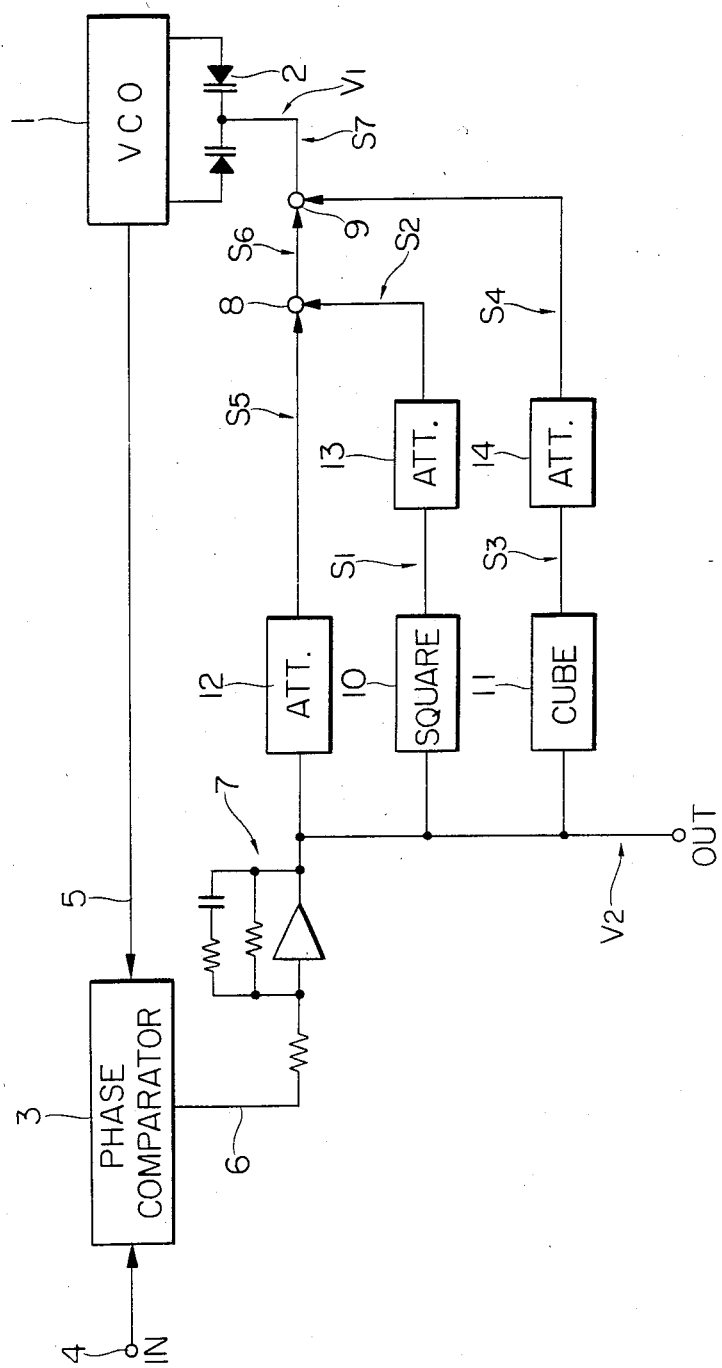
FIG. 1 is a circuit diagram of an FM demodulator as a first embodiment of the present invention.
Figure 2:
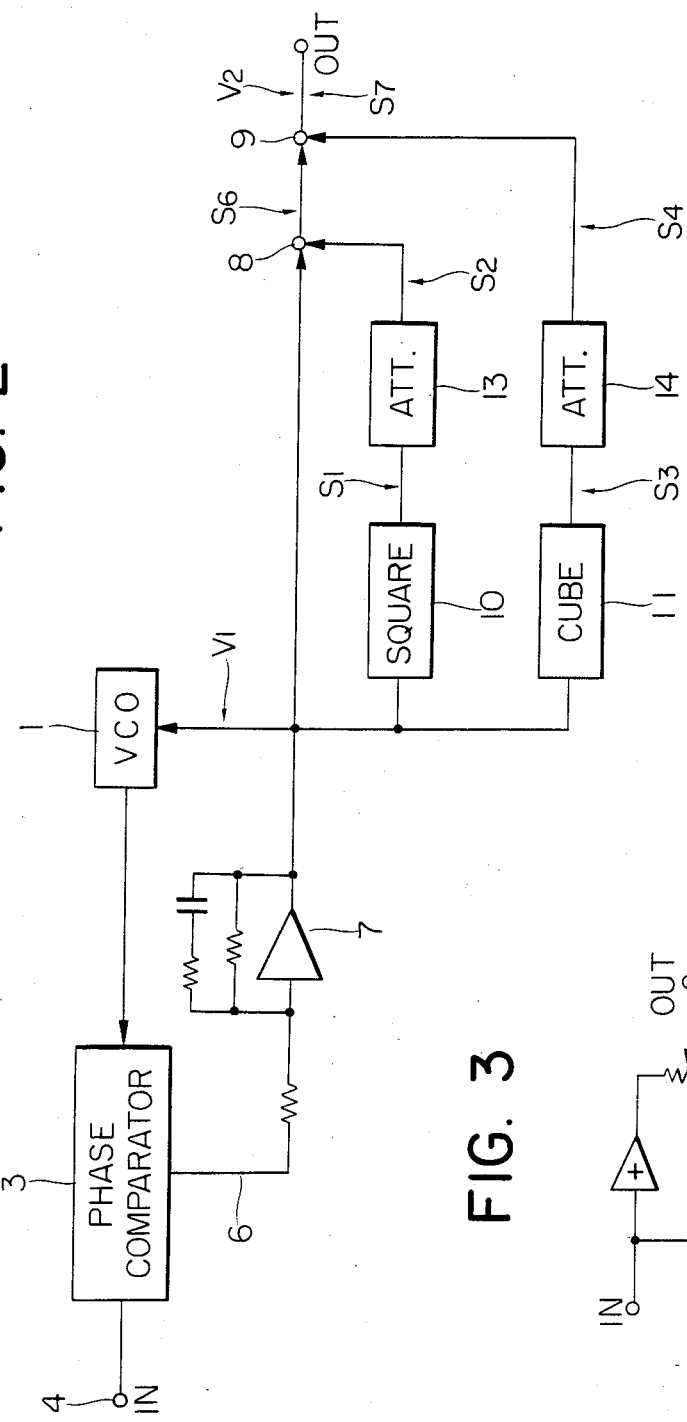
FIG. 2 is a circuit diagram of an FM demodulator as a second embodiment of the present invention.
Figure 3:
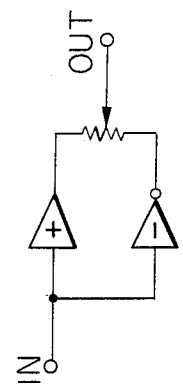
FIG. 3 shows a practical example of an attenuator to be used in the FM demodulator of the present invention.

A constitution of the present invention will be described hereinbelow with respect to FIGS. 1 to 3 showing its embodiments.

In the first embodiment shown in FIG. 1, a reference numeral 1 denotes an oscillator, whose oscillating frequency is controlled by a VARI-CAP diode 2. A reference numeral 3 indicates a phase comparator which serves to compare the phase of an FM signal applied to its input terminal 4 with that of a signal 5 from the oscillator 1. When there is a phase deviation between both signals, the phase comparator 3 outputs an output signal 6 responsive to its deviation. A numeral 7 is a low-pass filter equipped at the post stage of the comparator 3. Numerals 8 and 9 represent adders as synthesizers, respectively, in which the state is shown whereby two such adders are interposed between the low-pass filter 7 and the oscillator 1. Numerals 10 and 11 respectively show cumulative multiplication circuits which receive the signals from the low-pass filter 7. In this embodiment, the square multiplication circuit 10 and the cubic multiplication circuit 11 are included. The outputs of the square and cubic multiplication circuits 10 and 11 are respectively independently input to the adders 8 and 9. Although the above-mentioned two adders and two cumulative multiplication circuits were shown in the embodiment, these numbers are not always limited to two but at least each one adder and cumulative multiplication circuit may be provided. In addition, in the embodiment shown in FIG. 1, attenuators 12, 13 and 14 are respectively interposed between a set of adders 8, 9 and the low-pass filter 7, between the adder 8 and the square multiplication circuit 10, and between the adder 9 and the cubic multiplication circuit 11, thereby enabling the signal levels to be controlled finely. The operation principle of the first embodiment will now be described hereinbelow. In the case where the input voltage vs. output frequency characteristic of the oscillator is nonlinear, a control voltage $V_1$ to be applied to the VARI-CAP diode to the frequency deviation cos pt of the input is represented by $$V_1 = \sum_{n=1}^{\infty} a_0 \cos^n pt \quad (1)$$

Namely, although the multi-order harmonic distortion components occur, it is known that the fourth and higher harmonic distortion components are actually relatively small. Thus, expression (1) can be represented by the following approximate expression (2)

$$V_1 \doteq a_1 \cos pt + a_2 \cos^2 pt + a_3 \cos^3 pt \quad (2)$$

Wherein, $a_1$, $a_2$ and $a_3$ are constants depending upon the peculiar input voltage vs. output frequency characteristic of the VCO used. In the present invention, the magnitudes of the second and third harmonic distortion components are considered to be sufficiently lower than the level of the fundamental distortion component, i.e., $$a_1 >> a_2, \quad a_1 >> a_3$$

thereby eliminating the second and third harmonic distortion components from an FM demodulated output $V_2$ at the output terminal OUT. As a result of this, the present invention intends to obtain $$V_2 = \cos pt \quad (3)$$

In the FM demodulator of the embodiment of the present invention shown in FIG. 1, although the control voltage $V_1$ as shown in expression (2) has been applied to the VARI-CAP diode, it is assumed that the FM demodulated output $V_2$ which does not include the harmonic distortion, i.e., $V_2 = \cos pt$ is obtained. In such a case, an output $S_1$ from the square multiplication circuit 10 is represented by $$S_1 = (V_2)^2 = \cos^2 pt$$

while, an output $S_3$ from the cubic multiplication circuit 11 is indicated by $$S_3 = (V_2)^3 = \cos^3 pt$$

Now assuming that attenuation factors of the attenuators 13 and 14 are k and l, respectively, their outputs $S_2$ and $S_4$ are $$S_2 = k \cos^2 pt$$

$$S_4 = l \cos^3 pt$$

While, assuming that an attenuation factor of the attenuator 12 is m, its output $S_5$ is $$S_5 = m \cos pt$$

$$S_6 = m \cos pt + k \cos^2 pt$$

$$S_7 = m \cos pt + k \cos^2 pt + l \cos^3 pt$$

(wherein, $S_6$ is an output signal of the adder 8 and $S_7$ is an output signal of the adder 9.) In order to obtain $S_7 = V_1$, it is enough to set such that $a_3 = l$ $a_2 = k$ $a_1 = m$ At this time, the expression shown by expression (3) is satisfied, so that the second and third harmonic distortion components are eliminated from the demodulated signal.

Furthermore, when the voltage vs. frequency characteristic of the oscillator 1 is changed due to variation or the like of the characteristic of the VARI-CAP diode 2 and consequently $a_2$ and $a_3$ have negative values, the above-mentioned factors l and k may be also given as negative values.

FIG. 2 shows another embodiment, in which the adders 8 and 9 and the cumulative multiplication circuits 10 and 11 are positioned out of the closed loop of the PLL. In this embodiment, the control voltage $V_1$ shown in expression (3) is applied to the VCO 1 and the second and third harmonic distortion components are eliminated from the control voltage $V_1$ including such second and third harmonic distortions, thereby obtaining $V_2 = \cos pt$.

In accordance with the conditions $$a_2 << a_1, \quad a_3 << a_1,$$

$$S_1 = V_1^2 \doteq a_1^2 \cos^2 pt$$

$$S_3 = V_1^3 \doteq a_1^3 \cos^3 pt$$

and assuming that the attenuation factors of the attenuators 13 and 14 are k and l, respectively, $$S_2 = k \, a_1^2 \cos^2 pt$$

$$S_3 = l \, a_1^3 \cos^3 pt$$

Therefore, $$S_6 = V_1 + S_2 = a_1 \cos pt + (a_2 + k a_1^2) \cos^2 pt + a_3 \cos^3 pt$$

$$S_7 = S_6 + S_7 = a_1 \cos pt + (a_2 + k a_1^2) \cos^2 pt + (a_3 + l a_1^3) \cos^3 pt$$

The attenuation factors k and l of the attenuators 13 and 14 are set such that $$k = -\frac{a_2}{a_1^2}, \quad l = -\frac{a_3}{a_1^3},$$

the demodulated output $V_2$ ($S_7$) is $$V_2 = a_1 \cos pt$$

Moreover, it is not always necessary to use the resistors as the attenuators 13 and 14; namely, any parts which can change the levels may be used. Therefore, it is of course possible to use a part which can increase the level as shown in FIG. 3.

As described in the above two embodiments, there are equipped the circuit for setting off the second and third (if necessary, it is of course possible to increase or decrease the number of such circuits and to further set the degree into higher order) harmonic distortion components. In the embodiment shown in FIG. 1, this circuit is inserted in the PLL loop, while in the embodiment shown in FIG. 2, it is positioned out of the PLL loop.

I claim:

1. An FM demodulator phase locked loop (PLL) comprising:

a voltage controlled oscillator (VCO) for generating a signal of an oscillating frequency depending upon a control voltage;

a phase comparator for comparing the phase and the frequency of an input FM signal with the VCO frequency signal and generating an error signal which is related to the phase and the frequency difference between the compared signals;

a low-pass filter for attenuating the high frequency components of the error signal at the output of the phase comparator;

a circuit for producing harmonic distortion components from the output signal from the low-pass filter; and a circuit for combining the produced harmonic distortion components with the output signal of the low-pass filter so as to obtain non-distorted FM demodulated signal.

2. An FM demodulator in accordance with claim 1, wherein said harmonic distortion circuit includes means for squaring the output signal of the low-pass filter.

3. An FM demodulator in accordance with claim 1, wherein said harmonic distortion circuit includes means for cubing the output signal of the low-pass filter.

4. An FM demodulator in accordance with claim 1, wherein said combining means makes the sum of the produced harmonic distortion components and the output signal of the low-pass filter and applies the sum to the VCO as the control signal so that the output signal of the low-pass filter may become the non-distorted FM demodulated signal.

5. An FM demodulator in accordance with claim 1, wherein the output of the low-pass filter is applied to the VCO as the control signal, and said combining means makes the sum of the produced harmonic distortion components and the output signal of the low-pass filter so that the sum may become the non-distorted FM demodulated signal.

* * * * *